United States Patent [19]

Dudley et al.

[11] Patent Number: 4,480,222
[45] Date of Patent: Oct. 30, 1984

[54] ADJUSTABLE ELECTRICAL SHUNT

[75] Inventors: Carl K. Dudley, Petersburg, Mich.; Richard W. Mattson, Rossford, Ohio

[73] Assignee: Allied Corporation, Morris Township, Morris County, N.J.

[21] Appl. No.: 377,741

[22] Filed: May 13, 1982

[51] Int. Cl.³ .............................. G01R 1/20; H01C 5/00
[52] U.S. Cl. ..................................... 324/126; 338/49; 338/136
[58] Field of Search .................. 324/126; 338/97, 136, 338/162, 49

[56] References Cited

U.S. PATENT DOCUMENTS 1,114,515  10/1914  Pratt ..................................... 324/126
3,154,759  10/1964  Watrous ............................... 338/162

Primary Examiner—Ernest F. Karlsen
Attorney, Agent, or Firm—James P. DeClercq

[57] ABSTRACT

A current sensing device includes an electrically conductive current shunt member (10), and a voltage-responsive member (12). The current shunt member includes a first portion (14) having a free end (20), and a second arcuate portion (16) including an arcuate slot (38) defined by a constant radius (45) centered about the free end (20) of the first section, so that when current is passed through the arcuate section (16), the voltage produced by the shunt (10) may be varied by pivoting the voltage-responsive member (12) retained at the free end (20) of the first member and at the arcuate slot (38), and bridging or spanning between this first free end (20) and the arcuate slot (38). Preferably, the current-sensing member (12) includes electrical or electronic circuitry, for providing an output when sensed voltage, proportional to current through the arcuate portion, exceeds a predetermined level.

3 Claims, 4 Drawing Figures

ADJUSTABLE ELECTRICAL SHUNT

This application is related to the field of measuring electrical currents. In particular, the instant invention relates to an adjustable shunt mechanism, including a shunt element and a current-responsive member which is adjustable with respect to the shunt element.

BACKGROUND OF THE INVENTION

Although any resistive element interposed in an electrical current path for the purpose of generating a voltage drop proportional to the current flowing through the resistive element may be called a shunt, the term usually applies to what are known as laboratory or bench shunts. Such shunts typically include two rectangular blocks of copper or brass, fitted with provisions for connecting them in an electrical circuit, placed so as to define a gap between these blocks which are bridged by one or more thin, low cross-section elements. The width of the bridging element or elements is selectively trimmed, to produce a predetermined voltage across two binding posts disposed in the blocks on either side of the gap, when a predetermined current is passed through the laboratory or bench shunt. Such shunts are in common use for both measurement, and as part of control systems. However, in control systems, such shunts are often inconvenient and difficult to use, since an event may be intended to occur in response to an event which is only indirectly measured by the shunt, with various factors affecting the relationship between the desired causative event and the current through the shunt in any given application of such a shunt. Since the current-to-voltage proportionality of such a shunt is fixed, either the thin bridging elements must be trimmed, or the resultant voltage signal must be amplified and then selectively reduced in magnitude to provide the desired relationship. The instant invention provides a solution for these and other problems and difficulties in the prior art.

SUMMARY OF THE INVENTION

The instant invention provides an adjustable shunt member, including a first generally-straight, linearly-extending portion and a second arcuate portion, the arcuate portion including an arcuate slot, adapted to receive a voltage-responsive member placed between and spanning from a free end of the straight portion and the arcuate slot, so that, when current is passed through the arcuate member, the voltage-responsive member may be adjusted to produce a desired voltage signal for any current within a predetermined range of electrical currents. The voltage-responsive member may be a simple insulated planar member bearing studs fitting through an aperture in the free end of the straight portion and the linear slot, supporting leads to a sensing, indicating or control unit, or may incorporate an electronic control circuit which acts upon the voltage selected by the angular position of the voltage-responsive member within the angular slot.

Thus, it is an object of the invention to provide a current-sensing device including an electrically conductive shunt member and a voltage-responsive member, the current shunt member including a generally-straight portion and an arcuate portion, having a first end joined to or otherwise contiguous with a first end of the straight portion, the arcuate portion defining an arcuate slot therein, the slot defining a constant radius with respect to an aperture in a free end of the straight portion, so that a voltage-responsive member having two stud terminals may be placed with one stud terminal passing through the aperture in the free end of the generally-straight portion and the other stud terminal passing through the arcuate slot, so that the voltage sensed by the voltage-responsive member when a current is passed through the arcuate section may be adjusted by angularly adjusting the voltage-responsive member. Such a current-sensing device is easy and convenient to manufacture and use, and may be easily adjusted to establish a desired proportionality between the voltage caused by an electrical current in the current sensing device, and a causative event.

DETAILED DESCRIPTION OF THE INVENTION

Figure 1:
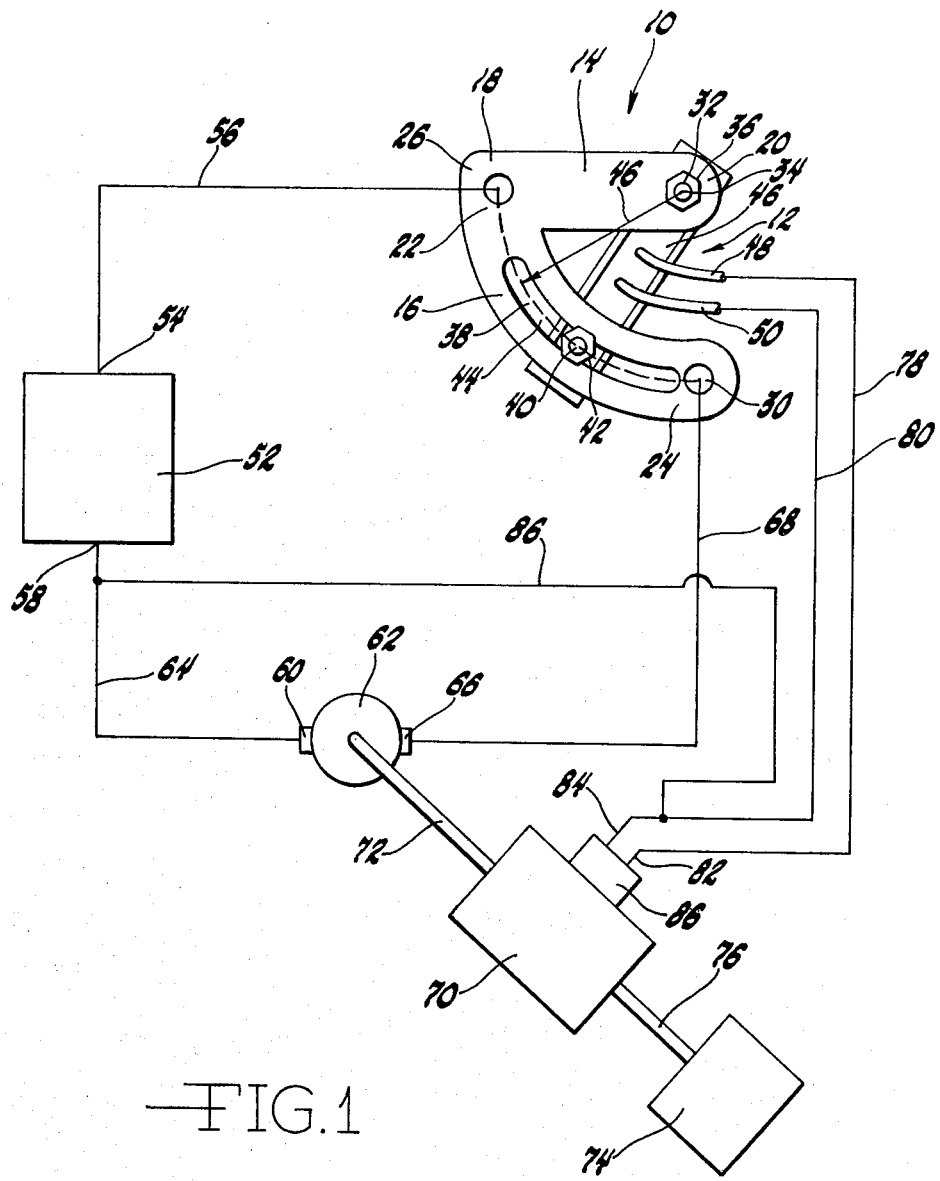
FIG. 1 is a partially schematic view illustrating the preferred use of a current-sensing device according to the invention.

Referring to FIG. 1, a current-sensing device 8 according to the invention includes an electrically conductive current shunt member 10 and a voltage-responsive member 12. Shunt member 10 is a generally-flat member including a first linearly extending portion 14, which is shown as a straight portion, although its shape is not critical to providing the benefits and advantages of the invention, and a second arcuate portion 16. Portion 14 has a first end portion 18 and a second end portion 20. Arcuate portion 16 includes a first end portion 22 and a second end portion 24. In the embodiment illustrated, portions 20 and 24 are free ends, and portions 18 and 22 are coextensive, and are preferably integral parts of current shunt member 10. Coextensive area 26, formed by portions 18 and 22, is adapted to be connected to an electrical circuit, such as by providing a mounting aperture 28. Second end portion 24 of arcuate portion 16 is also adapted to be connected to an electrical circuit, such as by the provision of a mounting aperture 30.

Second end portion 20 of portion 14 includes an aperture 32, adapted to receive a mounting stud 34 of voltage responsive member 12 therethrough. As shown, a retaining means shown as a nut 36 on mounting stud 34 acts to pivotably retain voltage-responsive member 12 to current shunt member 10.

Portion 16, although shown as an arcuate portion, need not itself define an arcuate profile, but necessarily includes an arcuate slot 38 adapted to receive therethrough a second mounting stud 40 of voltage-responsive member 12. Second mounting stud 40 is retained to current shunt member 10 by a retaining means shown as a nut 42. Arcuate slot 38 is of a width appropriate to receive mounting stud 40, and is centered about an arc 44, shown in broken line, defined by a constant radius 45 centered on aperture 32. When current is passed between area 26 and end 24 of arcuate portion 16, a voltage, for instance, proportional to the distance of the measurement point defined by stud 40 from coextensive area 26 to stud 40 and the cross-sectional area of arcuate portion 16 will be developed at stud 40. End portion 20 will be at the same potential as coextensive area 26, since only insignificant current would flow in portion 14. Thus, voltage-responsive member 12 may be adjusted to provide a desired voltage resulting from a predetermined current by angularly adjusting voltage-responsive member 12 about mounting stud 36 by sliding second mounting stud 40 within arcuate slot 38.

Although shown as incorporating electronic components, voltage-regulating member 12 may include merely a bridging or spanning member 46 which supports mounting studs 34 and 40, and which supports lead wires 48 and 50, which, in that instance, would be directly connected to mounting studs 34 and 40. However, in the preferred embodiment of the invention, voltage-responsive member 12 includes an electronic circuit which processes the voltage appearing between studs 34 and 40 and provides an output to lead wires 48 and 50.

In the system shown in FIG. 1, a power supply 52 has a first terminal 54 connected at mounting aperture 28 through line 56, and a second terminal 58 connected to a first terminal 60 of an electric motor 62 by a line 64. Motor 62 has a second terminal 66 connected to end 24 at aperture 30 by line 68. Thus, voltage-responsive member 12 responds to a voltage due to current flowing through motor 62, which is proportional to the torque load imposed upon such a motor by a proportionality constant, which may be experimentally determined.

Motor 62 is shown coupled to a transmission 70 through shaft 72, and transmission 70 is shown coupled to a load 74 through a shaft 76. Transmission 70 is a minor mechanical modification of the transmission shown in U.S. Pat. Nos. 4,198,145 and 4,198,146, both issued Jul. 4, 1978. The mechanical modification involved is the provision of means for adjusting the preload pressure of the traction disks of the infinitely-variable transmission there disclosed, to vary the transmission ratio irrespective of the position of a ratio selection arm, so that the transmission 70 may be automatically downshifted to provide torque required by load 74 without increasing torque supplied to shaft 72 above a predetermined limit, measured by sensing the current drawn by motor 62. As shown in FIG. 1, lines 78 and 80, connected respectively to lead wires 48 and 50, are connected respectively to terminals 82 and 84 of a downshift solenoid 86, which may act on transmission 70 either directly or preferably by acting on a hydraulic circuit.

Figure 2:
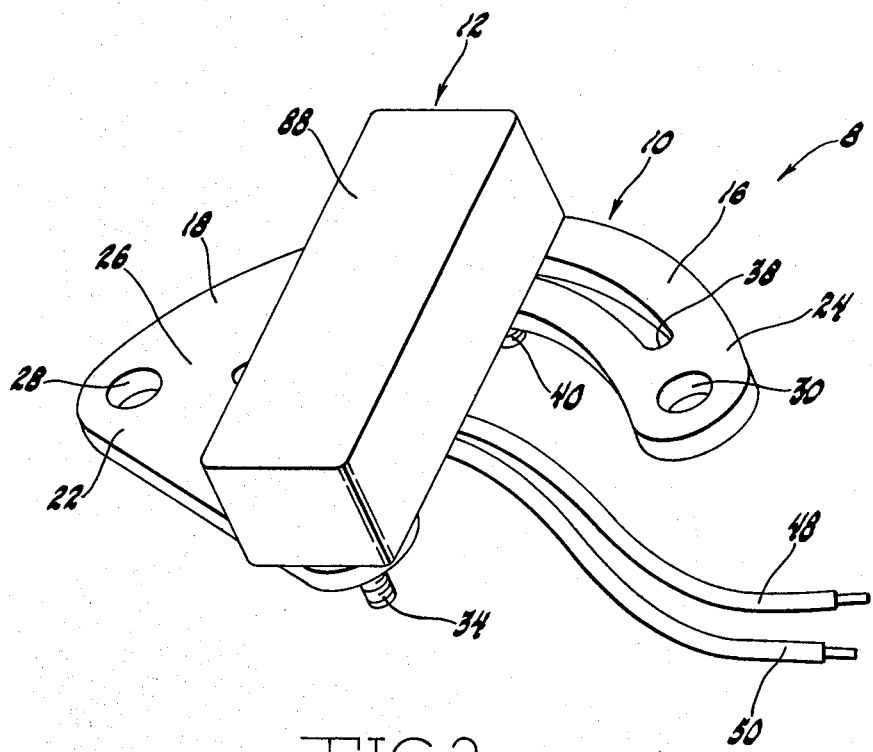
FIG. 2 is a top perspective view of a current sensing device according to the invention.
Figure 3:
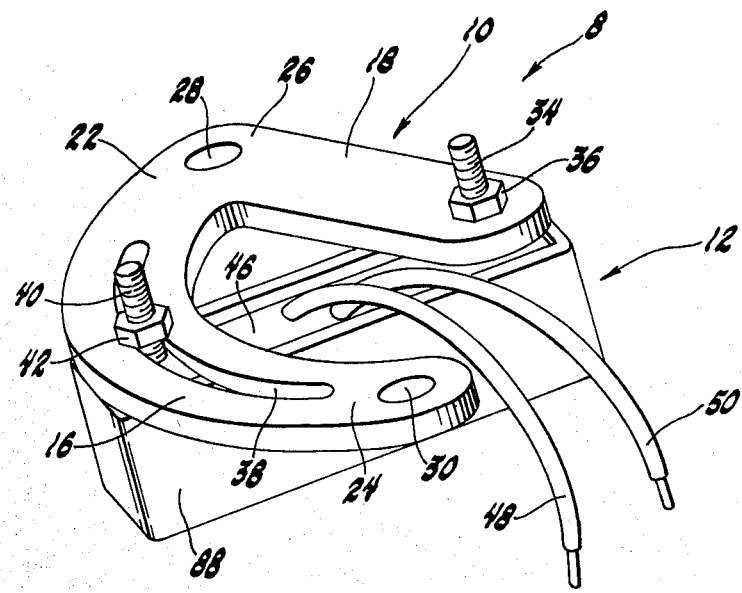
FIG. 3 is a bottom perspective view of a current sensing device according to the invention.

In the embodiment illustrated, voltage-responsive member 12 receives operating power for its electronic components through line 80 and lead wire 50, a line 86 being connected between terminal 58 of power supply 52 and terminal 84 of downshift solenoid 86. It will be apparent that solenoid 86 may be a continuously-variable device, providing a varying ratio in response to varying torque loads reflected in the current flowing through motor 62, or may preferably be a device which acts to cause a stepwise change in transmission ratio in response to a predetermined current level through motor 62. FIGS. 2 and 3 illustrate top and bottom perspective views of a current sensing device 8 according to the preferred embodiment of the invention. As best shown in these figures, voltage-responsive member 12 includes a housing or cover portion 88, in addition to bridging or spanning member 46. As is most clearly illustrated in FIG. 3, nuts 36 and 42 are used to clampingly retain voltage-responsive member 12 in position, after it has been pivotably adjusted about threaded mounted stud 34 by moving stud 40 within arcuate slot 38.

Figure 4:
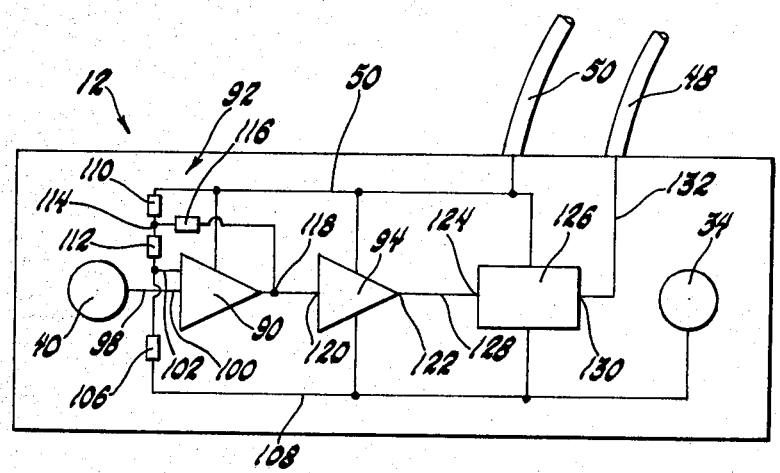
FIG. 4 is a schematic diagram of the preferred form of a voltage-responsive member usable in conjunction with the current shunt member to form a current-sensing device according to the invention.

FIG. 4 illustrates in partially symbolic form the electronic circuit incorporated in voltage-responsive member 12. As shown, lead wire 50 supplies power to comparator 90, comparison voltage source 92, amplifier 94 and output switch 126. As will be apparent, output switch 126 is necessary when the current to be supplied through lead wire 48 is in excess of the output capability of comparator 90 or amplifier 94. As shown, stud 40 supplies the sensed voltage to be processed, and stud 34 is the ground return for comparator 90, amplifier 94, and output switch 126, if used. As shown, a line 98 interconnects stud 40 and inverting input 100 of comparator 90, while noninverting input 102 is connected to junction 104 of comparison voltage source 92.

Comparison voltage source 92, as shown, includes a first resistor 106 connected between junction 104 and return line 108, connected to stud 34, and the series combination of second and third resistors 110 and 112, joined at junction 114, and connected between line 50 and junction 104. A feedback resistor 116 is connected between output 118 of comparator 90 and junction 114, to increase the hysteresis of comparator 90.

Amplifier means 94 has a signal input 120 connected to output 118 of comparator 90 by line 110. Amplifier 94 has an output 122 either directly connected to lead wire 48 or connected to input 124 of output switch 126 by line 128. If used, output switch 126 has an output 130 connected, to lead wire 48 by line 132. Thus, a voltage caused by current through arcuate portion 16 will be compared with a comparison voltage by comparator 90, and, if the signal appearing at input 100 of amplifier means 90 exceeds the voltage determined by comparison voltage source 92, output 118 of comparator means 90 will be energized, energizing amplifier 94, and output switch 126, if used, interconnecting lead wires 48 and 50 to cause the desired result.

Thus, the invention provides a simple and convenient means for quickly adjusting the proportionality constant between current through a shunt and the voltage output of the shunt, which can be adjusted to compensate for the lack of a predictable relationship between current flowing through the shunt and a desired result or indication.

In view of the above, it will be apparent to one skilled in the art, that numerous modifications and variations of the invention may be easily made, and may be made without departing from the spirit or scope of the invention.

We claim:

1. A current-sensing device, comprising:
   an electrically conductive current shunt member adapted to be interposed in an electrical circuit;
   a voltage-responsive member affixed to said current shunt member for providing an electrical output responsive to electrical current flowing through said current shunt member;
   said current shunt member being a flat member including a first portion and a second arcuate portion;
   said first portion having a first end portion and a second end portion, said second end being a free end and adapted to receive a first terminal of said voltage-responsive member;

said second portion having a first end and a second end, said second end being a free end and adapted to be connectd to said electrical circuit;

said first end of said first portion and said first end of said second portion being coextensive and adapted to be connected to said electrical circuit;

said second portion defining an arcuate slot therein, said arcuate slot having a radius centered on said second end and having a slot width adapted to receive a second terminal of said voltage-responsive member;

said second terminal of said voltage-responsive member being slidable in said arcuate slot to angularly position said voltage-responsive member to adjust the voltage sensed by said voltage-responsive member when a first predetermined electrical current is passed through said current shunt member.

2. A current-sensing device according to claim 1, wherein:
said voltage-responsive member includes comparator means and amplifier means operably connected to said comparator means, and is adapted to provide said electrical output when said voltage sensed by said voltage-responsive member reaches a predetermined magnitude.

3. A current-sensing device according to claim 2, wherein:
said voltage-responsive member further includes switch means responsive to said comparator means for providing said electrical output.

* * * * *